United States Patent
Sekiya

(10) Patent No.: US 9,607,872 B2
(45) Date of Patent: Mar. 28, 2017

(54) INLINE SYSTEM

(71) Applicant: Disco Corporation, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 707 days.

(21) Appl. No.: 13/959,816

(22) Filed: Aug. 6, 2013

(65) Prior Publication Data
US 2014/0050552 A1 Feb. 20, 2014

(30) Foreign Application Priority Data

Aug. 15, 2012 (JP) ................................. 2012-180070

(51) Int. Cl.
*H01L 21/677* (2006.01)
*H01L 21/68* (2006.01)
*H01L 21/67* (2006.01)

(52) U.S. Cl.
CPC ...... *H01L 21/67703* (2013.01); *H01L 21/681* (2013.01); *H01L 21/67259* (2013.01); *H01L 21/67276* (2013.01)

(58) Field of Classification Search
CPC ......... H01L 21/67173; H01L 21/67213; H01L 21/67219; H01L 21/67259; H01L 21/67276; H01L 21/67703; H01L 21/67739; H01L 21/681
USPC ..................................................... 414/222.02
See application file for complete search history.

(56) References Cited

U.S. PATENT DOCUMENTS

| | | | | |
|---|---|---|---|---|
| 5,664,337 A * | 9/1997 | Davis | ................ | H01L 21/67173 34/184 |
| 6,591,161 B2 * | 7/2003 | Yoo | .................... | H01L 21/67796 414/800 |
| 7,069,099 B2 * | 6/2006 | Hashinoki | ......... | H01L 21/67276 700/110 |
| 7,281,869 B2 * | 10/2007 | Akimoto | ................. | H01L 21/00 118/52 |
| 8,545,118 B2 * | 10/2013 | Ogura | ............... | H01L 21/67196 396/611 |
| 9,165,807 B2 * | 10/2015 | Fukutomi | ........... | H01L 21/6715 |
| 9,184,071 B2 * | 11/2015 | Ogura | ............... | H01L 21/67173 |

FOREIGN PATENT DOCUMENTS

JP    10-284449    10/1998

* cited by examiner

*Primary Examiner* — Michael McCullough
*Assistant Examiner* — Brendan Tighe
(74) *Attorney, Agent, or Firm* — Greer Burns & Crain, Ltd.

(57) ABSTRACT

An inline system including a first apparatus having a first processing unit for processing a workpiece and an unloading area for unloading the workpiece processed by the first processing unit, a second apparatus having a loading area for loading the workpiece unloaded from the unloading area and a second processing unit for processing the workpiece loaded to the loading area, a transfer unit for transferring the workpiece from the unloading area to the loading area, and a position detecting unit for imaging the unloading area to detect the position of the unloading area and also imaging the loading area to detect the position of the loading area. The transfer unit transfers the workpiece from the unloading area to the loading area according to the position of the unloading area and the position of the loading area detected by the position detecting unit.

6 Claims, 5 Drawing Sheets

INLINE SYSTEM

BACKGROUND OF THE INVENTION

Field of the Invention

The present invention relates to an inline system such that a workpiece is transferred between a plurality of apparatuses and the workpiece is processed in each apparatus.

Description of the Related Art

A plurality of devices such as ICs and LSIs are formed on the front side of a wafer. The back side of the wafer is ground by a grinding apparatus to reduce the thickness of the wafer to a predetermined thickness. Thereafter, the wafer is divided into the individual devices by a dicing apparatus. These devices thus obtained are used in various electronic equipment such as mobile phones and personal computers. To continuously perform the back grinding of the wafer and the dividing of the wafer into the devices, the present applicant has proposed an inline system configured by connecting the grinding apparatus and the dicing apparatus in an inline fashion to thereby perform the grinding, transferring, and dicing in series (see Japanese Patent Laid-open No. Hei 10-284449, for example).

SUMMARY OF THE INVENTION

However, in unloading a workpiece such as a wafer from the upstream apparatus and loading this workpiece to the downstream apparatus, the workpiece must be reliably transferred from the upstream apparatus to the downstream apparatus, so that the layout of these apparatuses is required to be accurate, causing a problem such that considerable time is consumed. Further, also in the case of replacing or adding an apparatus, the apparatus must be accurately positioned, causing troublesome work.

It is therefore an object of the present invention to provide an inline system such that a workpiece is transferred between a plurality of apparatuses and the workpiece is processed in each apparatus, wherein even though the layout of these apparatuses is not accurate, the workpiece can be reliably transferred between these apparatuses.

In accordance with an aspect of the present invention, there is provided an inline system including a first apparatus having first processing means for processing a workpiece and an unloading area for unloading the workpiece processed by the first processing means; a second apparatus having a loading area for loading the workpiece unloaded from the unloading area and second processing means for processing the workpiece loaded to the loading area; transfer means for transferring the workpiece from the unloading area of the first apparatus to the loading area of the second apparatus; and position detecting means for imaging the unloading area of the first apparatus to detect the position of the unloading area and also imaging the loading area of the second apparatus to detect the position of the loading area; the transfer means transferring the workpiece from the unloading area to the loading area according to the position of the unloading area and the position of the loading area detected by the position detecting means.

According to the present invention, the position detecting means operates to image the unloading area of the first apparatus and detect the position of the unloading area. Further, the position detecting means also operates to image the loading area of the second apparatus and detect the position of the loading area. Then, the transfer means operates to transfer the workpiece from the unloading area to the loading area according to the position of the unloading area and the position of the loading area detected above. Accordingly, even though the layout of the first apparatus and the second apparatus is not accurate, the workpiece can be reliably transferred from the unloading area of the first apparatus to the loading area of the second apparatus.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
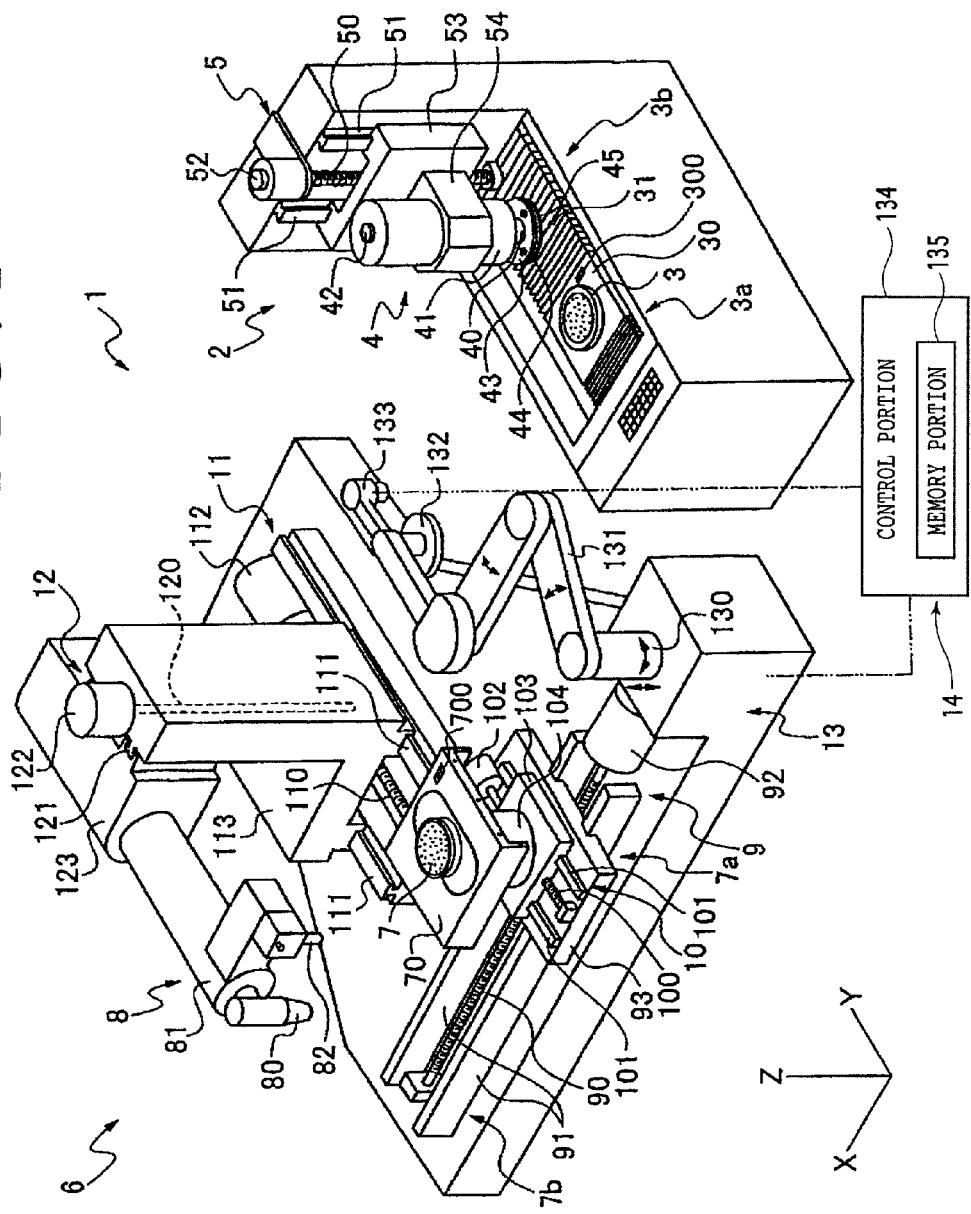
FIG. 1 is a perspective view of an inline system according to a preferred embodiment of the present invention.

Referring to FIG. 1, there is shown an inline system 1 according to a preferred embodiment of the present invention. The inline system 1 shown in FIG. 1 is composed of a grinding apparatus 2 as a first apparatus and a laser processing apparatus 6 as a second apparatus. The positions of various parts included in the grinding apparatus 2 and the laser processing apparatus 6 are recognized in a three-dimensional X-Y-Z coordinate space. The grinding apparatus 2 is composed of a holding table 3 for holding a workpiece, first processing means (grinding unit) 4 for performing grinding to the workpiece held on the holding table 3, and feeding means 5 for moving the first processing means 4 toward and away from the workpiece held on the holding table 3.

The holding table 3 is rotatable and also movable between an unloading area 3a formed at the front stroke end as viewed in the Y direction and a grinding area 3b formed at the rear stroke end as viewed in the Y direction. The unloading area 3a is an area where the workpiece processed by the first processing means 4 is unloaded, and the grinding area 3b is an area where grinding by the first processing means 4 is performed. A cover table 30 is provided so as to surround the holding table 3. A pair of expansible bellows 31 is connected to the front and rear ends of the cover table 30 as viewed in the Y direction. A mark 300 for use in imaging the holding table 3 is formed on the cover table 30.

The first processing means 4 is composed of a rotating shaft (spindle) 40 having an axis extending in the Z direction, a housing 41 for rotatably supporting the rotating shaft 40, a motor 42 for rotationally driving the rotating shaft 40, a wheel mount 43 fixed to the lower end of the rotating shaft 40, and a grinding wheel 44 mounted on the lower surface of the wheel mount 43. A plurality of abrasive members 45 are fixed to the lower surface of the grinding wheel 44 so as to be arranged annularly. Accordingly, when the rotating shaft 40 is rotated by the motor 42 in the first processing means 4, the grinding wheel 44 is also rotated together with the rotating shaft 40.

The feeding means 5 is composed of a ball screw 50 having an axis extending in the Z direction, a pair of guide rails 51 extending parallel to the ball screw 50, a pulse motor 52 connected to one end of the ball screw 50, a vertically moving member 53 slideably mounted on the guide rails 51 and provided with an internal nut (not shown) threadedly engaged with the ball screw 50, and a holder 54 connected to the vertically moving member 53 for holding the housing 41. Accordingly, when the ball screw 50 is rotated by the pulse motor 52 in the feeding means 5, the vertically moving member 53 is guided by the guide rails 51 to vertically move in the Z direction, thereby vertically moving the first processing means (grinding unit) 4 held by the holder 54.

The laser processing apparatus 6 includes a holding table 7 for holding a workpiece and second processing means (laser beam applying means) 8 for performing laser processing to the workpiece held on the holding table 7. The holding table 7 is supported by feeding means 9 so as to be movable in the X direction between a loading area 7a formed at the right stroke end as viewed in the X direction and a processing area 7b formed at the left stroke end as viewed in the X direction. The loading area 7a is an area where the workpiece to be processed by the second processing means 8 is loaded, and the processing area 7b is an area where laser processing by the second processing means 8 is performed.

The holding table 7 is supported by the feeding means 9 so as to be movable in the X direction as mentioned above. The holding table 7 is also supported by Y-direction adjusting means 10 so as to be movable in the Y direction perpendicular to the X direction in a horizontal plane. The second processing means 8 is supported by Y-direction moving means 11 so as to be movable in the Y direction and also supported by Z-direction moving means 12 so as to be movable in the Z direction. The feeding means 9 is composed of a ball screw 90 having an axis extending in the X direction, a pair of guide rails 91 extending parallel to the ball screw 90, a motor 92 connected to one end of the ball screw 90, and a slide plate 93 having a lower portion slideably mounted on the guide rails 91 and provided with an internal nut (not shown) threadedly engaged with the ball screw 90. Accordingly, when the ball screw 90 is rotated by the motor 92, the slide plate 93 is moved on the guide rails 91 in the X direction.

The Y-direction adjusting means 10 for moving the holding table 7 in the Y direction is provided on the slide plate 93. The Y-direction adjusting means 10 is composed of a ball screw 100 having an axis extending in the Y direction, a pair of guide rails 101 extending parallel to the ball screw 100, a pulse motor 102 connected to one end of the ball screw 100, and a moving base 103 having a lower portion slideably mounted on the guide rails 101 and provided with an internal nut (not shown) threadedly engaged with the ball screw 100. Accordingly, when the ball screw 100 is rotated by the pulse motor 102, the moving base 103 is moved on the guide rails 101 in the Y direction. A cylindrical member 104 is connected to the moving base 103 so as to stand upright therefrom, and a pulse motor (not shown) for rotationally driving the holding table 7 is provided in the cylindrical member 104. A cover table 70 is provided so as to surround the holding table 7. A mark 700 for use in imaging the holding table 7 is formed on the cover table 70.

The second processing means 8 includes a processing head 80 for applying a laser beam downwardly. The processing head 80 is fixed to a cylindrical housing 81. An imaging unit 82 for imaging the workpiece is also fixed to the cylindrical housing 81, so that an area to be applied by the laser beam can be detected by the imaging unit 82.

The Y-direction moving means 11 is composed of a ball screw 110 having an axis extending in the Y direction, a pair of guide rails 111 extending parallel to the ball screw 110, a pulse motor 112 connected to one end of the ball screw 110, and a moving base 113 having a lower portion slideably mounted on the guide rails 111 and provided with an internal nut (not shown) threadedly engaged with the ball screw 110. Accordingly, when the ball screw 110 is rotated by the pulse motor 112, the moving base 113 is moved on the guide rails 111 in the Y direction, thereby moving the second processing means 8 in the Y direction.

The Z-direction moving means 12 is composed of a ball screw 120 having an axis extending in the Z direction, a pair of guide rails 121 extending parallel to the ball screw 120, a pulse motor 122 connected to one end of the ball screw 120, and a vertically moving member 123 slideably mounted on the guide rails 121 and provided with an internal nut (not shown) threadedly engaged with the ball screw 120. Accordingly, when the ball screw 120 is rotated by the pulse motor 122, the vertically moving member 123 is moved on the guide rails 121 in the Z direction, thereby moving the second processing means 8 in the Z direction.

The laser processing apparatus 6 includes transfer means 13 for transferring the workpiece between the grinding apparatus 2 and the laser processing apparatus 6. The transfer means 13 includes a shaft portion 130 that is rotatable and vertically movable, a foldable arm portion 131 connected to the shaft portion 130, a holding portion 132 for holding the workpiece under suction at the front end of the arm portion 131, a camera 133 connected to the holding portion 132, and a control portion 134 for controlling the motion of the shaft portion 130 and the arm portion 131. The control portion 134 includes a CPU and a memory portion 135. An image obtained by the camera 133 is transmitted to the control portion 134 and subjected to image processing in the control portion 134, thereby detecting the position of the unloading area 3a in the grinding apparatus 2 and the position of the loading area 7a in the laser processing apparatus 6. Accordingly, the camera 133 and the control portion 134 function as position detecting means 14 for imaging the unloading area 3a and the loading area 7a to detect the positions of these areas 3a and 7a. The mount position of the camera 133 is not limited to that shown in FIG. 1. For example, the camera 133 may be provided independently of the transfer means 13.

The following steps may be performed by using the inline system 1 shown in FIG. 1, wherein grinding is performed to a workpiece by the grinding apparatus 2 to reduce the thickness of the workpiece and laser processing is next performed to the workpiece by the laser processing 6.

(1) Self-Teach Step (Position Detecting Step)

Figure 2:
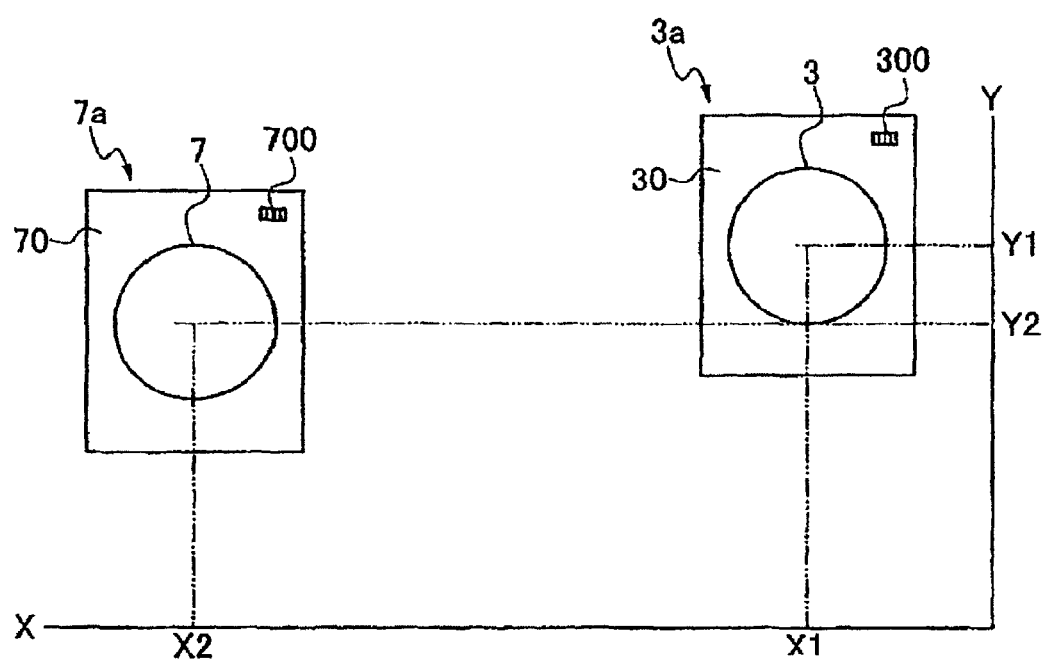
FIG. 2 is a plan view for illustrating the position of an unloading area and the position of a loading area in an X-Y coordinate system.
Figure 3:
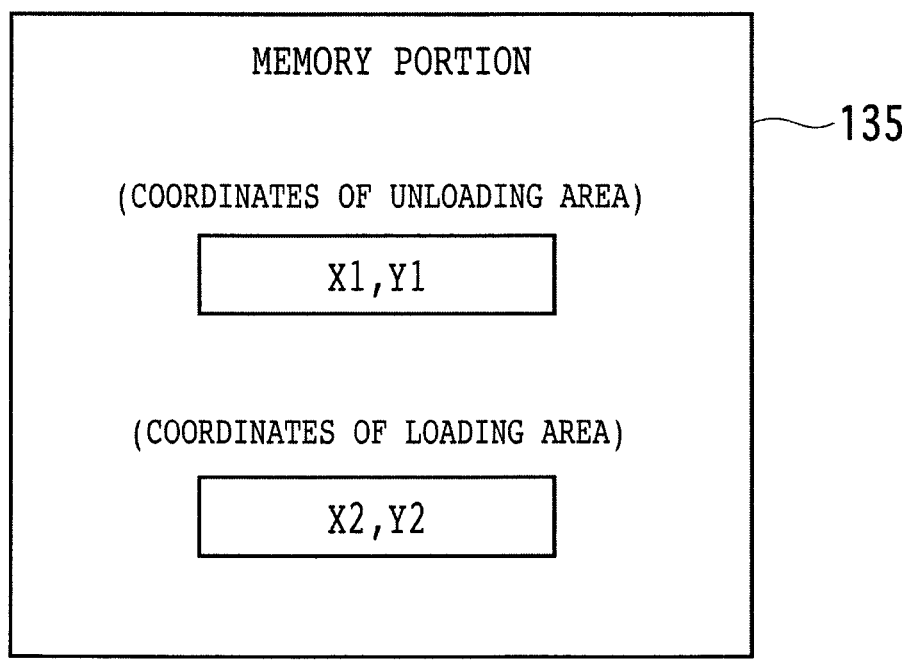
FIG. 3 is a block diagram for illustrating the contents stored in a memory portion.

Prior to starting the processing of the workpiece in the grinding apparatus 2 and the laser processing apparatus 6, the holding table 3 of the grinding apparatus 2 is positioned in the unloading area 3a and the camera 133 constituting the position detecting means 14 is operated to image the unloading area 3a. Then, the mark 300 formed on the cover table 30 is detected. At this time, the coordinates of the holding table 3 are obtained from the coordinates of the camera 133 and the positional relation between the mark 300 and the holding table 3, and then stored into the memory portion 135. For example, as shown in FIGS. 2 and 3, the coordinates (X1, Y1) of the center of the holding table 3 upon detection of the mark 300 near the holding table 3 positioned in the unloading area 3a are stored into the memory portion 135. In this manner, the position of the unloading area 3a is detected and its coordinate information is stored into the memory portion 135 (unloading area detecting step).

Similarly, the loading area 7a is imaged by the camera 133 constituting the position detecting means 14. Then, the mark 700 formed on the cover table 70 is detected. At this time, the coordinates of the holding table 7 are obtained from the coordinates of the camera 133 and the positional relation between the mark 700 and the holding table 7, and then stored into the memory portion 135. For example, as shown in FIGS. 2 and 3, the coordinates (X2, Y2) of the center of the holding table 7 upon detection of the mark 700 near the holding table 7 positioned in the loading area 7a are stored into the memory portion 135. In this manner, the position of the loading area 7a is detected and its coordinate information is stored into the memory portion 135 (loading area detecting step).

(2) First Processing Step

Figure 4:
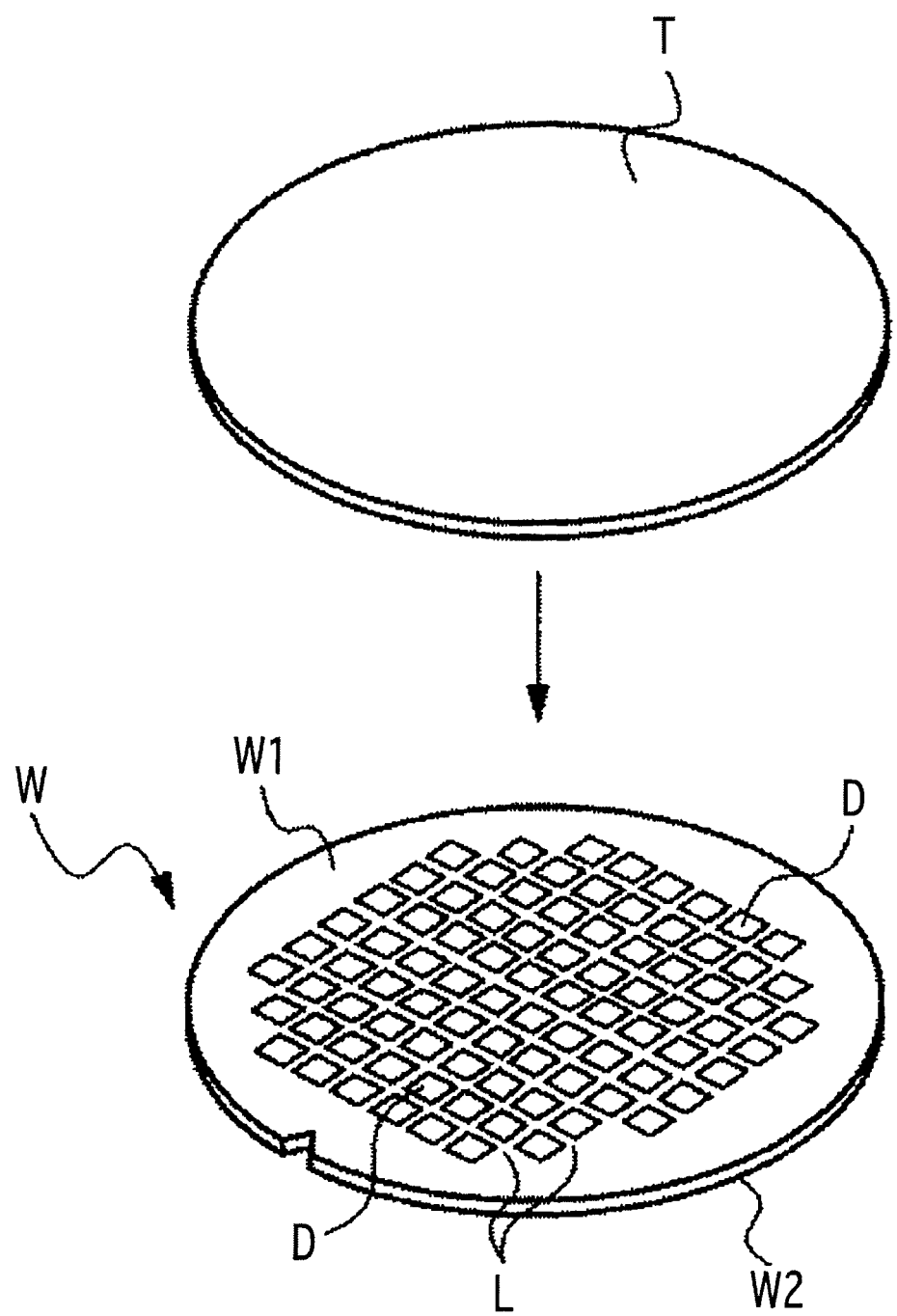
FIG. 4 is a perspective view of a wafer and a protective tape to be attached to the wafer.
Figure 5:
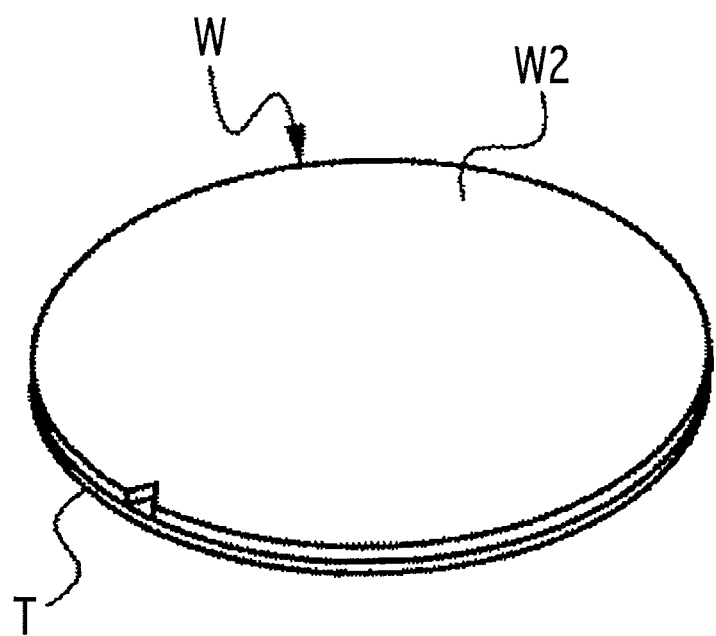
FIG. 5 is a perspective view of the wafer with the protective tape attached thereto.

In the case of grinding the back side W2 of a wafer W shown in FIG. 4 as a workpiece by using the grinding apparatus 2, a protective tape T is attached to the front side W1 of the wafer W in order to protect a plurality of devices D formed on the front side W1 so as to be partitioned by a plurality of crossing division lines L. Thereafter, the wafer W is turned upside down as shown in FIG. 5 to obtain the condition where the back side W2 is oriented upward. The holding table 3 of the grinding apparatus 2 shown in FIG. 1 is positioned in the unloading area 3a and the wafer W is next held on the holding table 3 in the condition where the protective tape T comes into contact with the upper surface of the holding table 3. Thereafter, the holding table 3 is moved to the grinding area 3b. In the grinding area 3b, the holding table 3 is rotated and the grinding wheel 44 is also rotated. In this condition, the first processing means 4 is lowered to bring the rotating abrasive members 45 into contact with the back side W2 of the rotating wafer W, and then fed downward to grind the back side W2 of the wafer W. When the thickness of the wafer W is reduced to a predetermined thickness by this grinding, the first processing means 4 is raised to finish this grinding.

(3) Transfer Step

After finishing this grinding, the holding table 3 is moved to the unloading area 3a. Thereafter, the holding portion 132 constituting the transfer means 13 is moved to the position defined by the coordinates (X1, Y1) preliminarily stored in the memory portion 135. Thereafter, the holding portion 132 is lowered to pick up the wafer W under suction from the holding table 3. Since the coordinates (X1, Y1) of the holding table 3 positioned in the unloading area 3a are preliminarily stored in the memory portion 135, the holding portion 132 can reliably pick up the wafer W without deviation in position.

Thereafter, the holding table 7 of the laser processing apparatus 6 is preliminarily positioned in the loading area 7a, and the arm portion 131 of the transfer means 13 is raised and swiveled to thereby move the holding portion 132 holding the wafer W to the position defined by the coordinates (X2, Y2) preliminarily stored in the memory portion 135. At this position, the holding portion 132 is lowered to place the wafer W on the holding table 7 with the suction force of the holding portion 132 removed. Thereafter, the wafer W is held on the holding table 7 under suction in the condition where the protective tape T comes into contact with the upper surface of the holding table 7, i.e., the ground back side W2 of the wafer W is exposed. Since the coordinates (X2, Y2) of the holding table 7 positioned in the loading area 7a are preliminarily stored in the memory portion 135, the holding portion 132 can be accurately positioned at the coordinates (X2, Y2) by the control portion 134, so that the wafer W can be reliably carried and held on the holding table 7 without deviation in position of the holding portion 132.

(4) Second Processing Step

After transferring the wafer W to the holding table 7 and holding it thereon, the holding table 7 is moved to a position below the imaging unit 82. At this position, the wafer W is imaged by infrared radiation applied from the imaging unit 82 to thereby detect the division lines L formed on the front side W1 of the wafer W. Thereafter, an alignment between a predetermined one of the division lines L extending in a first direction and the processing head 80 is performed in the Y direction. After performing this alignment, the holding table 7 is moved in the X direction and at the same time a laser beam is applied from the processing head 80 to the wafer W along this predetermined division line L, thereby performing ablation on the back side W2 of the wafer W along this predetermined division line L.

Thereafter, the second processing means 8 is indexed in the Y direction with the pitch of the division lines L by operating the Y-direction moving means 11, and the laser beam is sequentially applied along all of the other division lines L extending in the first direction. Thereafter, the holding table 7 is rotated 90° to similarly perform the laser processing along all of the division lines L extending in a second direction perpendicular to the first direction. As a result, ablation is performed on the back side W2 of the wafer W along all of the division lines L extending in the first and second directions. As a modification, a laser beam having a transmission wavelength to the wafer W may be focused inside the wafer W to thereby form a modified layer inside the wafer W.

As described above, the position detecting means 14 operates to image the unloading area 3a of the grinding apparatus 2 as the first apparatus and detect the position of the unloading area 3a. Further, the position detecting means 14 also operates to image the loading area 7a of the laser processing apparatus 6 as the second apparatus and detect the position of the loading area 7a. Then, the transfer means 13 operates to transfer the workpiece from the unloading area 3a to the loading area 7a according to the position of the unloading area 3a and the position of the loading area 7a detected above. Accordingly, even though the layout of the grinding apparatus 2 and the laser processing apparatus 6 is not accurate, the workpiece can be reliably transferred from the unloading area 3a of the grinding apparatus 2 to the loading area 7a of the laser processing apparatus 6.

While the transfer means 13 is included in the laser processing apparatus 6 as the second apparatus in the inline system 1 shown in FIG. 1, the transfer means 13 may be included in the grinding apparatus 2 as the first apparatus or may be provided independently of the first apparatus and the second apparatus. Further, the first apparatus may be any apparatus other than the grinding apparatus 2 and the second apparatus may be any apparatus other than the laser processing apparatus 6.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An inline system comprising:
a first apparatus having first processing means for processing a workpiece and an unloading area for unloading said workpiece processed by said first processing means;
a second apparatus having a loading area for loading said workpiece unloaded from said unloading area and second processing means for processing said workpiece loaded to said loading area, wherein said second apparatus is spaced from said first apparatus, and further wherein said first apparatus and said second apparatus are independently positionable, with respect to each other, within the inline system;
transfer means for transferring said workpiece from said unloading area of said first apparatus to said loading area of said second apparatus; and
position detecting means for imaging said unloading area of said first apparatus to detect the position of said unloading area and also imaging said loading area of said second apparatus to detect the position of said loading area;
said transfer means transferring said workpiece from said unloading area to said loading area according to the position of said unloading area and the position of said loading area detected by said position detecting means,
wherein said first apparatus includes a first holding table for holding the workpiece, and further wherein said first holding table is configured and arranged to be movable, with respect to the first apparatus, between the unloading area and a first processing area, where the workpiece can be processed by said first processing means, and
wherein said second apparatus includes a second holding table for holding the workpiece, and further wherein said second holding table is configured and arranged to be movable, with respect to second apparatus, between the loading area and a second processing area, where the workpiece can be processed by said second processing means.

2. The inline system according to claim 1, wherein:
said first apparatus comprises a grinding apparatus for performing grinding upon the workpiece; and
said second apparatus comprises a laser processing apparatus for performing laser processing upon the workpiece.

3. The inline system according to claim 1, wherein said transfer means comprises:
a rotatable shaft portion;
a foldable arm portion connected to the rotatable shaft portion; and
a holding portion for holding the workpiece, wherein the holding portion is connected to the foldable arm portion.

4. The inline system according to claim 1, further comprising:
a first mark located at a predetermined position with respect to the unloading area, wherein said first mark is configured and arranged for use in imaging the unloading area by said position detecting means; and
a second mark located at a predetermined position with respect to the loading area, wherein said second mark is configured and arranged for use in imaging the loading area by said position detecting means.

5. The inline system according to claim 1 wherein said position detecting means is configured and arranged to determine the X and Y coordinates of the position of said unloading area and to determine the X and Y coordinates of the position of said loading area.

6. The inline system according to claim 5, wherein:
said X and Y coordinates of the position of said unloading area are stored in a memory; and
said X and Y coordinates of the position of said loading area are stored in the memory.

* * * * *